US007312729B2

(12) United States Patent
Radakovic

(10) Patent No.: US 7,312,729 B2
(45) Date of Patent: Dec. 25, 2007

(54) UNIVERSAL SAMPLING RATE CONVERTER IN ELECTRONIC DEVICES AND METHODS

(75) Inventor: Daniela Radakovic, Park Ridge, IL (US)

(73) Assignee: Motorola, Inc., Schaumburg, IL (US)

( * ) Notice: Subject to any disclaimer, the term of this patent is extended or adjusted under 35 U.S.C. 154(b) by 603 days.

(21) Appl. No.: 10/919,819

(22) Filed: Aug. 17, 2004

(65) Prior Publication Data

US 2006/0039514 A1 Feb. 23, 2006

(51) Int. Cl.
*H03M 7/00* (2006.01)
(52) U.S. Cl. ...................................................... 341/61
(58) Field of Classification Search ................ 341/123, 341/110, 144, 61
See application file for complete search history.

(56) References Cited

U.S. PATENT DOCUMENTS 6,327,311 B1 * 12/2001 Ojard .......................... 375/261
6,384,759 B2 * 5/2002 Snyder ........................ 341/123
7,167,112 B2 * 1/2007 Andersen et al. ............. 341/61

OTHER PUBLICATIONS

Julius O. Smith III, Center for Computer Research in Music and Acoustics (CCRMA), Stanford University, "The Digital Audio Resampling Home Page", http://ccrma-www.stanford.edu/~jos/resample/Abstract.html, Apr. 13, 2004, 30 pages.

* cited by examiner

*Primary Examiner*—Brian Young
(74) *Attorney, Agent, or Firm*—Roland K. Howler, II

(57) ABSTRACT

A method and apparatus for converting the sampling rate of digital signals including a decimating comprising a low pass filter (122) and a downsampler (124), wherein the input signal is decimated a number of times based on a ratio of an input sampling rate to an output sampling rate. The exemplary apparatus also includes an upsampler (130) and another decimator (140) wherein the signal is upsampled after decimating if a ratio of the input sampling rate to an output sampling rate is not a power of an integer number.

13 Claims, 2 Drawing Sheets

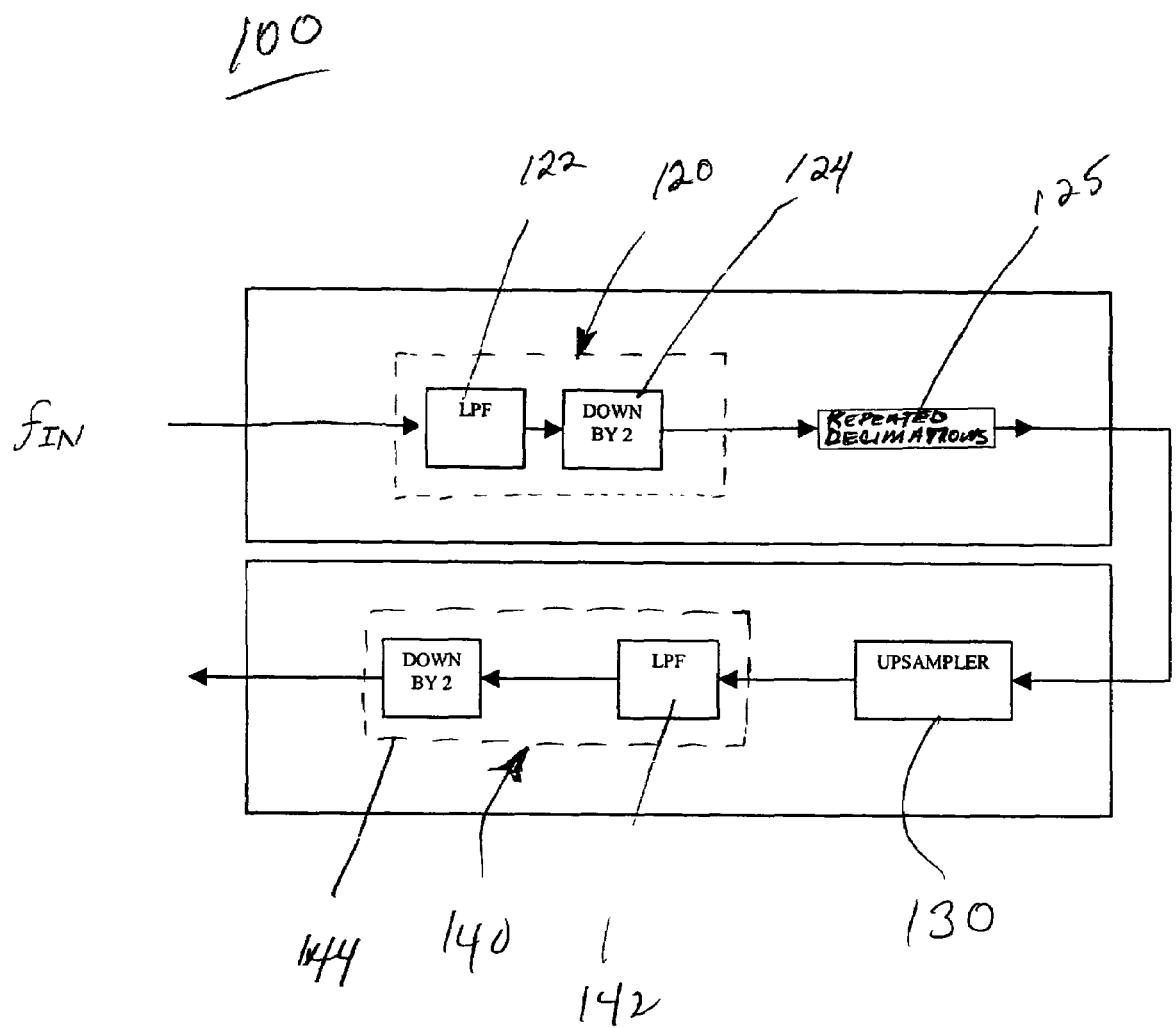

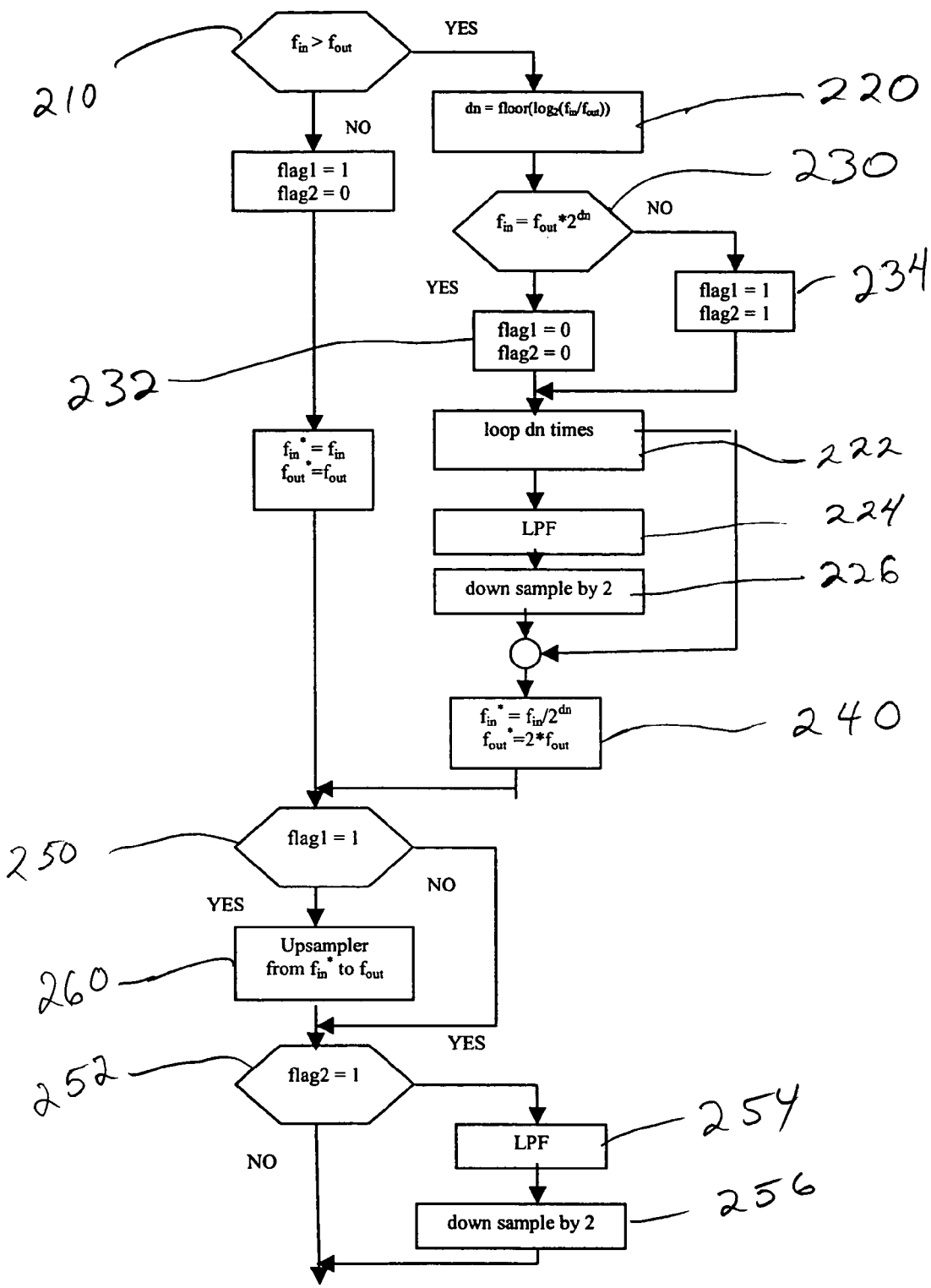

UNIVERSAL SAMPLING RATE CONVERTER IN ELECTRONIC DEVICES AND METHODS

FIELD OF THE DISCLOSURE

The present disclosure relates generally to digital signal sampling, and more particularly to universally converting the sampling rate of digital signals, for example, converting the sampling rate of audio signals, sampling rate conversion devices and methods therefor.

BACKGROUND OF THE DISCLOSURE

Currently, multimedia accessories in cellular telephones and other portable electronic devices operate with audio signals sampled at a variety of sampling rates. In some applications it is necessary to convert between many input and output frequency pairs to support different accessories and features, such as audio signal mixing in video games. Conversion between input and output frequency pairs is also required to support peripheral device protocols, for example, Bluetooth headsets and other devices.

Sampling rate conversion is currently implemented in cellular telephones and other portable electronic devices only for a few input and output frequency pairs using a traditional sampling rate conversion approach. In the traditional approach, the input sampling rate $f_{in}$ and output sampling rate $f_{out}$ are predetermined and fixed. The sampling rate converter is implemented as a series of conversion stages, wherein the conversion between $f_{in}$ and $f_{out}$ is done by first converting $f_{in}$ to $f_1$, then $f_1$ to $f_2, \ldots, f_{n-1}$ to $f_n$, and finally $f_n$ to $f_{out}$. Every stage converts its input sampling frequency by a factor of L/M. Each conversion stage is comprised of an up-sampler by factor L, a low-pass filter and a down-sampler by factor M. The low-pass filter limits the bandwidth to the min($f_k/2$ M, $f_k/2$ L).

The traditional multi-stage approach to sampling rate conversion is, however, impractical in applications requiring conversion between many different input and output frequency pairs, since multiple filtering stages must be implemented for each pair. The traditional approach requires substantial amounts of memory for code implementation. In some applications, the traditional sampling rate conversion approach is MIPS intensive, depending on the number of stages necessary to perform the conversion. The traditional approach is also relatively inflexible since additional low-pass filters must be added to the filter bank for each new sampling rate and each new conversion requirement.

A known alternative to the traditional multi-stage sampling rate conversion approach is to provide universal sampling rate conversion for arbitrary input and output sampling rates. The alternative approach uses input samples and a table of sinc function values in order to calculate samples at an output sampling rate. Different elements of the table are read based on input and output sampling frequencies to determine the necessary indices of the table elements.

The universal sampling rate conversion approach is limited in the down-sampler case since there is a requirement that the input signal have a bandwidth B, such that $2B<f_{out}$. According to Shannon's theorem, a signal may be reconstructed from its samples by bandlimited interpolation when the condition $2B<f_{out}$ is satisfied, where B is the bandwidth of the input signal and $f_{OUT}$ is the output sampling rate. These conditions are not satisfied for many applications including the downsampling of audio signals in cellular telephones and other devices. For these and other applications, it is necessary to pre-filter the input signals in order to appropriately limit their bandwidth before executing the down-sampler portion using this known universal approach. However, pre-filtering is impractical since different low-pass filter combinations are required for different input and output frequencies and it would be necessary to maintain a bank of low-pass filters to process input signals before the sampling rate conversion.

The various aspects, features and advantages of the disclosure will become more fully apparent to those having ordinary skill in the art upon careful consideration of the following Detailed Description thereof with the accompanying drawings described below.

BRIEF DESCRIPTION OF THE DRAWINGS

FIG. 1 is a block diagram of an exemplary digital sampling rate converter.

FIG. 2 is an exemplary digital sampling rate process flow diagram.

DETAILED DESCRIPTION

The disclosure pertains to universal sampling rate converters and methods for converting between any two input and output sampling frequencies, wherein predetermination of the input and output frequency pairs is not required. The purpose of sampling rate conversion is to obtain signal samples at a desired sampling rate $f_{out}$ for samples of the same signal at some known input sampling rate $f_{in}$. According to the embodiments disclosed herein, the output signal may be either an up-sampled or down-sampled version of the input signal.

The disclosed sampling rate converter comports with Shannon's sampling theorem without requiring the banks of low pass filters for bandwidth limiting prior to sampling rate conversion. Assume a band-limited baseband continuous signal x(t) with bandwidth B. All the samples of this signal, sampled at input sampling rate fin>2B, are known:

$$x(nT_{in}), n=-\infty,+\infty \qquad (1)$$

where $T_{in}$ is the sampling period such that $$T_{in} = \frac{1}{f_{in}} \qquad (2)$$

The original continuous signal x(t) is then expressed in terms of these $$x(t) = \sum_{n=-\infty}^{+\infty} x(nT_{in})h(t-nT_{in}) \qquad (3)$$

where h(t) is the sinc function given as $$h(t) = \begin{cases} 1, & t=0 \\ \frac{\sin(\pi t)}{\pi t}, & t \neq 0 \end{cases} \qquad (4)$$

The samples of the original continuous signal x(t) at a sampling rate $f_{out}>2B$ can be expressed as:

$$x(mT_{out}) = \sum_{n=-\infty}^{+\infty} x(nT_{in})h(mT_{out} - nT_{in}) \quad (5)$$

where $T_{out}$ is the sampling period such that $$T_{out} = \frac{1}{f_{out}} \quad (6)$$

In order to obtain samples at the desired sampling rate $f_{out}$, it is only necessary to know the values of the samples at the input sampling rate $f_{in}$, the input sampling period $T_{in}$, the output sampling period $T_{out}$, and values of the sinc function at particular points in time. The above formula is modified so that it uses a limited number of input samples. The expression that one exemplary algorithm is based on is as follows:

$$x(mT_{out}) = \sum_{n=N1}^{N2} x(nT_{in})h(mT_{out} - nT_{in}) \quad (7)$$

where N1 and N2 are indices of the beginning and ending samples.

In one embodiment, the proposed sampling rate converter comprises a decimator and an upsampler. In downsampling applications, the input samples are sampled at the rate $f_{in}$, such that $f_{in} > 2B$. The output samples are at the sampling rate $f_{out}$, such that $f_{out} < f_{in}$. In downsampling applications using the exemplary sampling rate converters, the input signal is inherently bandwidth limited during decimation, discussed further below, without the requirement that the input signal be bandwidth limited by pre-filtering the input signals before down-sampling as in the prior art.

In FIG. 2, at logical block 210, a determination is made as to whether the input signal will be upsampled or downsampled. In downsampling applications, the input signal is decimated repeatedly based on a ratio of the input sampling rate to an output sampling rate ($f_{IN}/f_{OUT}$). Each decimation step includes low-pass filtering and down-sampling steps. In FIG. 1, the decimator 120 includes a low pass filter (LPF) 122 and a downsampler 124. The LPF used in the decimator lets through all the frequency components in the range $[-\pi/2, \pi/2]$ out of $[-\pi, \pi]$, i.e. one-half of the existing frequency bandwidth. More generally, the low pass filter in the decimator passes all frequency components in the range $-pi/k$ to $+pi/k$, where k is some integer value.

In FIG. 1, the decimator block 120 comprising the LPF 122 and the downsampler 124 is generally applied repeatedly to the input signal. The number of times that LPF and downsampler are applied to the signal depends on the input and output sampling rates as discussed below. In one particular embodiment, the number of times, n, the bandwidth reduced input signal is decimated is based on a logarithm of a ratio of the input sampling rate to the output sampling rate ($f_{in}/f_{out}$) as expressed below:

$$d_n = \lfloor \log_N p \rfloor \quad (8)$$

where $p = (f_{in}/f_{out})$. In one embodiment, the logarithm base is N=2. More generally, a logarithmic base other 2 may be used in other implementations. It may also be seen from equation (8) that in some sampling rate applications decimation at block 120 is not required. In FIG. 1, multiple decimations are illustrated as occurring at block 125, though in some applications there may be only a single decimation, and in other embodiments the number of times the input signal is decimated is based on the ratio of the input sampling rate to an output sampling rate ($p = f_{IN}/f_{OUT}$) in equation (8) is zero.

In FIG. 2, at block 220, a value for "dn" is computed using expression (8) above. In the exemplary process, a counter at block 222 controls the number of decimator iterations at the LPF block 224 and downsample block 226 based on the evaluation of expression (8) at block 220. In FIG. 1, the exemplary downsampler 124 dowsamples by a factor of 2, though other downsampling factors could be used in other implementations, as suggested.

Downsampling is performed in one or two stages. At the first stage, the input signal is decimated by the LPF and downsampled. The process of the first stage generally occurs multiple times depending on the logarithm of the ratio of the input to output sampling rates as discussed above. Then in some instances, the second stage processing is applied. In the second stage, upsampling and one more decimation, i.e., filtering and downsampling, steps are applied. Whether the second stage processing is necessary may be determined by evaluation of the following expression:

$$p = 2^k \quad (9)$$

where $p = (f_{IN}/f_{OUT})$. The second stage processing is required only if the evaluation of the expression (9) is not true. In the process diagram of FIG. 2, expression (9) is evaluated at block 230, and one or more flags are set at block 232 and 234 depending on the result at block 230.

In FIG. 2, at block 240, the sampling rate of the input signal to the upsampling block, as well as the sampling rate of the output signal from the upsampling block are determined based on the number of decimator iterations determined at block 220 and occurring at schematic block 120 in FIG. 1, before and after the upsampler and the input and output sampling rates of the system. In FIG. 1, the upsampling occurs at schematic block 130. The point in the processing that the upsampler is invoked is generally dependant on the number of MIPS allowed and memory availability.

In FIG. 2, at block 250, if flag1 is equal to 1 at block 234 above, the signal is upsampled at block 260. The flag1 indicates whether or not it is necessary to apply the upsampling block. In applications where downsampling is to be performed and the input sampling rate is equal to the output sampling rate multiplied by a power of 2 (or more generally an integer k), the downsampling can be achieved by one or more decimation steps, and upsampling is unnecessary. The upsampler is discussed further below. In FIG. 2, the process proceeds to block 252 where the condition of flag2 is evaluated. If flag2 is equal to 1, the signal is subject to another lowpass filtering at block 254 and to downsampling at block 256. In FIG. 1, decimator 140 includes a lowpass filter 142 and a downsampler 144, which correspond to filtering and downsampling blocks 254 and 256 in FIG. 2, respectively.

Aliasing is not a concern when upsampling, since the output sampling rate is higher than the input sampling rate. Therefore the equation (7) above may be applied directly. Before equation (7) is applied, however, it is necessary to establish values of N1 and N2, i.e., the range of input samples used in the computation of the $m^{th}$ output sample.

If the output sample being computed is at the time $t_{out}=mT_{out}$, then index of the first input sample to the left of it at time $t_1=n_1T_{in}$ must be determined, as well as the index of the first input sample to the right at time $t_r=n_2T_{in}$ (note that $n_2=n_1+1$). Once these indices of the input samples are found, equal numbers of samples to the left and to the right of the output sample are used, therefore N1=n1−N+1, N2=n2+N−1. The exact number of samples used on each side is arbitrary and depends on the design. In one embodiment, the number of samples is approximately N=13.

The next step is the determination of the values of the sinc function used in equation (7). In one embodiment, these values are prestored in a memory table. The number of values in the table depends on the number of input samples used, as well as on the precision of the computed output sample required. The number of the input samples used dictates how many lobes of the sinc function to store. If the number of input samples used on each side of the output sample is N, the number of lobes stored is also N. For every sinc function lobe a certain number of samples, for example, 32, are stored in the table. Sinc function values not in the table may be interpolated from existing values.

Determining the sinc elements that must be read from the table of the sinc function values is a function of the upsampler. This procedure is simplified since only a single index k into the sinc table must be computed based on the input sampling frequency, the output sampling frequency and the output sample number. The computed index is used to read the sinc function value from the table that multiplies the first input sample to the right of the output sample, i.e., $x(n_2)$. All the other values of the sinc function used on the input samples to the right of the output sample are obtained by incrementing the calculated index k by spz (number of samples per lobe). The index used to read sinc function value to multiply the first input sample to the left of the output sample, i.e., $x(n_1)$ is calculated as j=spz−k. All the other values of the sinc function used on the input samples to the left of the output sample are obtained by incrementing the calculated index j by spz. The proposed approach for the upsampler also utilizes the fact that some output samples should have identical value as input samples. In these instances the computation described in the previous sections could be omitted and replaced by simply assigning the input sample value to the output sample. This will result in considerable MIPS savings (up to 50% in certain input and output frequency cases) compared with the traditional currently implemented approach.

The potential applications of the exemplary universal sampling rate converter include bringing multiple signals, for example, audio signals, to the same sampling rate to enable mixing them, and converting the signals to a particular sampling rate supported by hardware.

While the present disclosure and what are presently considered to be the best modes thereof have been described in a manner establishing possession by the inventors and enabling those of ordinary skill in the art to make and use the same, it will be understood and appreciated that there are many equivalents to the exemplary embodiments disclosed herein and that modifications and variations may be made thereto without departing from the scope and spirit of the inventions, which are to be limited not by the exemplary embodiments but by the appended claims.

What is claimed is:

1. A method in a digital signal sampling rate converter that reduces a sampling rate of an input signal, the method comprising:
    decimating the input signal a number of times based on a ratio of the input sampling rate to an output sampling rate;
    upsampling and decimating again and after repeatedly decimating if a condition is satisfied.

2. The method of claim 1, upsampling and decimating again after decimating a number of times if a ratio of the input sampling rate to the output sampling rate is not equal to a power of some integer value.

3. The method of claim 1, reducing a bandwidth of the input signal when decimating.

4. The method of claim 3, reducing the bandwidth of the input signal so that the output sampling rate is greater than a multiple of 2 times the reduced bandwidth of the input signal.

5. The method of claim 1, each decimation of the input signal includes a lowpass filtering step and a downsampling step.

6. The method of claim 1, decimating the input signal a number of times based on a logarithm of the ratio of the input sampling rate to the output sampling rate.

7. The method of claim 1, decimating the input signal a number of times using a single decimator.

8. A method in a digital signal sampling rate converter, the method comprising:
    decimating an input signal an input sampling,
    decimating includes low pass filtering and downsampling;
    upsampling and decimating again after decimating the input signal only if a ratio of the input sampling rate to an output sampling rate is not a power of an integer number,
    the output sampling rate less than the input sampling rate.

9. The method of claim 8, decimating the input signal repeatedly by decimating the input signal a number of times based on a logarithm of the ratio of the input sampling rate to the output sampling rate.

10. The method of claim 8, reducing the bandwidth of the input signal sampled at the first rate such that the output sampling rate is greater than a multiple of 2 times the reduced bandwidth of the input signal.

11. A method in a universal digital signal sampling rate converter, the method comprising:
    downsampling an input signal;
    upsampling and decimating again after downsampling the input signal only if a ratio of an input sampling rate to an output sampling rate is not equal to a power of an integer number.

12. The method of claim 11, downsampling by decimating the input signal a number of times based on a ratio of the input sampling rate to the output sampling rate.

13. The method of claim 12, decimating includes an act of low pass filtering followed by an act of downsampling.

* * * * *